US009418839B2

(12) United States Patent
Zaretski et al.

(10) Patent No.: US 9,418,839 B2
(45) Date of Patent: Aug. 16, 2016

(54) METHOD FOR THE FABRICATION AND TRANSFER OF GRAPHENE

(71) Applicant: The Regents of the University of California, Oaklane, CA (US)

(72) Inventors: Aliaksandr Zaretski, San Diego, CA (US); Darren J. Lipomi, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/745,114

(22) Filed: Jun. 19, 2015

(65) Prior Publication Data

US 2015/0371848 A1 Dec. 24, 2015

Related U.S. Application Data

(60) Provisional application No. 62/015,116, filed on Jun. 20, 2014.

(51) Int. Cl.
*H01L 21/02* (2006.01)
*H01L 21/283* (2006.01)
*C01B 31/04* (2006.01)

(52) U.S. Cl.
CPC ...... *H01L 21/02527* (2013.01); *C01B 31/0484* (2013.01); *H01L 21/022* (2013.01); *H01L 21/0262* (2013.01); *H01L 21/02425* (2013.01); *H01L 21/02658* (2013.01); *H01L 21/283* (2013.01); *H01L 21/02664* (2013.01)

(58) Field of Classification Search
CPC ............. H01L 21/02527; H01L 21/02664; H01L 21/022; H01L 21/02425; H01L 21/0262; H01L 21/02658; C01B 31/0484
See application file for complete search history.

(56) References Cited

U.S. PATENT DOCUMENTS

| | | | |
|---|---|---|---|
| 8,916,451 B2 | 12/2014 | Bayram et al. | |
| 9,096,050 B2 | 8/2015 | Bedell et al. | |
| 2010/0323164 A1 | 12/2010 | Ogihara et al. | |
| 2012/0248416 A1* | 10/2012 | Zhou | B82Y 10/00 257/29 |
| 2013/0025907 A1 | 1/2013 | Zheng et al. | |
| 2013/0098540 A1 | 4/2013 | Lee et al. | |
| 2014/0001152 A1 | 1/2014 | Zurutuza Elorza et al. | |
| 2014/0162433 A1 | 6/2014 | Willner | |
| 2014/0335681 A1 | 11/2014 | Lee et al. | |
| 2014/0339506 A1 | 11/2014 | Dimitrakopoulos et al. | |
| 2015/0228728 A1 | 8/2015 | Dimitrakopoulos et al. | |

OTHER PUBLICATIONS

'tradeservice.com' [online]. "Copper Pricing 2015," May 2014, [retrieved on Jun. 26, 2015]. Retrived from internet: URL <http://www.tradeservice.com/copper_pricing/>. 3 pages.

(Continued)

*Primary Examiner* — Long Pham
(74) *Attorney, Agent, or Firm* — Fish & Richardson P.C.

(57) ABSTRACT

Provided herein are processes for transferring high quality large-area graphene layers (e.g., single-layer graphene) to a flexible substrate based on preferential adhesion of certain thin metallic films to graphene followed by lamination of the metallized graphene layers to a flexible target substrate in a process that is compatible with roll-to-roll manufacturing, providing an environmentally benign and scalable process of transferring graphene to flexible substrates.

27 Claims, 5 Drawing Sheets

(56) References Cited

OTHER PUBLICATIONS

'www.alfa.com' [online]. "11392 Copper foil, 0.5mm (0.02in) thick, Puratronic®, 99.9985% (metals basis)," May 20, 2014, [retrieved Jun. 30, 2015]. Retrieved from the Internet: URL<http://www.alfa.com/en/catalog/11392>. 4 pages.

'www.epa.gov' [online] "Calculations and References," May 2014, [retrieved Jun. 26, 2015]. Retrieved from the Internet: URL <htto://www.epa.gov/cleanenergy/energy-resources/refs.html>. 16 pages.

Bae et al., "Roll-to-roll production of 30-inch graphene films for transparent electrodes," Nat Nanotechnol, Aug. 2010, 5(8): 574-578.

Edwards and Coleman, "Graphene synthesis: relationship to applications," Nanoscale, Jan. 2013, 5(1): 38-51.

Ferrari et al., "Raman Spectrum of Graphene and Graphene Layers," Phys. Rev. Lett., 97: 187401.

Geim and Novoselov, "The rise of graphene," Nature Materials, 2007, 6: 183-191.

Hamada and Otani, "Comparative van der Waals density-functional study of graphene on metal surfaces," Phys. Rev., 82, 153412.

Kim et al., "Layer-Resolved Graphene Transfer via Engineered Strain Layers," Science, 342: 833-836.

Li et al., "Growth of Adlayer Graphene on Cu Studied by Carbon Isotope Labeling," Nano Lett., 2013, 13(2): 486-490.

Li et al., "Transfer of Large-Area Graphene Films for High-Performance Transparent Conductive Electrodes," Nano let, 2009, 9(12): 4359-4363.

Liu et al., "Package-Free Flexible Organic Solar Cells with Graphene top Electrodes," Advanced Materials, Aug. 2013, 25(31): 4296-4301.

Meitl et al., "Transfer printing by kinetic control of adhesion to an elastomeric stamp," Nature Materials, 2006, 5: 33-38.

Meng et al., "All-Graphene Core-Sheath Microfibers for All-Solid-State, Stretchable Fibriform Supercapacitors and Wearable Electronic Textiles," Advanced Materials, Apr. 2013, 2326-2331.

Nie et al., "Growth from below: bilayer graphene on copper by chemical vapor deposition," New J. Phys., 14: 093028.

Ramuz et al., "Evaluation of Solution-Processable Carbon-Based Electrodes for All-Carbon Solar Cells," ACS Nano, 2012, 6(11): 10384-10395.

Schwierz, "Graphene transistors," Nat Nanotechnol, Jul. 2010, 5(7): 487-496.

Song et al., "Disposable biosensor based on graphene oxide conjugated with tryosinase assembled gold nanoparticles," Biosens Bioelectron, Mar. 2011, 26(7): 3181-6.

van der Zande et al., "Large-scale arrays of single-layer graphene resonators," Nano Lett, Dec. 2010, 10(12): 4869-73.

Vlassiouk et al., "Large scale atmospheric pressure chemical vapor deposition of graphene," Carbon, Apr. 2013, 54: 58-67.

Williams et al., "The 1.7 Kilogram Michrochip: Energy and Material Use in the Production of Semiconductor Devices," Environ. Sci. Technol., 2002, 36(24): 5504-5510.

Yoon et al., "Direct Measurement of Adhesion Energy of Monolayer Graphene As-Grown on Copper and Its Application to Renewable Transfer Process," Nano Lett, 2012, 12(3): 1448-1452.

Yu et al., "Control and characterization of individual grains and grain boundaries in graphene grown by chemical vapour deposition," Nature Materials, 2011, 10: 443-449.

Yu et al., "Solution-processed graphene/MnO2 nanostructured textiles for high-performance electrochemical capacitors," Nano Lett, Jul. 2011, 11(7): 2905-11.

Zaretski and Lipomi, "Processes for non-destructive transfer of graphene: widening the bottleneck for industrial scale production," Nanoscale, 2015, 7: 9963-9969.

Zhang et al., "Graphene: a versatile nanoplatform for biomedical applications," Nanoscale, 2012, 4: 3833-3842.

Zhang et al., "Low-Temperature Chemical Vapor Deposition Growth of Graphene from Toluene on Electropolished Copper Foils," ACS Nano, 2012, 6(3): 2471-2476.

Unarunotai et al., "Transfer of graphene layers grown on SiC wafers to other substrates and their integration into field effect transistors," Appl. Phys. Lett., 2009, 95(202101):1-3.

International Search Report and Written Opinion in Application No. PCT/US2015/036679, mailed on Dec. 11, 2015, 11 pages.

\* cited by examiner

FIG. 2a-h

FIG. 5a-e

METHOD FOR THE FABRICATION AND TRANSFER OF GRAPHENE

CROSS-REFERENCE TO RELATED APPLICATIONS

This application claims the benefit of U.S. Application No. 62/015,116, filed on Jun. 20, 2014, which is incorporated by reference herein in its entirety.

FEDERALLY SPONSORED RESEARCH OR DEVELOPMENT

This invention was made with Government support under Grant Nos. FA9550-13-1-0156 awarded by the Air Force Office of Scientific Research and DGE-1144086 awarded by the National Science Foundation Graduate Research Fellowship. The Government has certain rights in the invention.

TECHNICAL FIELD

The invention relates to the field of graphene and more particularly to methods for transferring graphene layers onto a substrate.

BACKGROUND

Graphene is an allotrophic form of carbon that consists of a two-dimensional hexagonal arrangement of carbon atoms. Each layer of graphene is essentially a one-atom-thick planar layer of carbon atoms that are bonded in a honeycomb crystal lattice. Graphene can be in forms having one, two, hundreds or thousands of graphene layers. The electrical, mechanical, optical and chemical properties of graphene make it attractive for applications in high performance electronic and optical devices and is expected to play a significant role in future technologies that span a range from consumer electronics, to devices for the conversion and storage of energy, to conformable biomedical devices for healthcare. To realize these applications, however, a low-cost method of synthesizing large areas of high-quality graphene is required. Current methods for growing high-quality large-area single-layer graphene that are compatible with roll-to-roll manufacturing are highly wasteful, destroying approximately 300 kg of copper foil (thickness=25 µm) for every 1 g of graphene produced. Efforts to reduce this waste have been driven by two goals. The first goal is to reduce the cost and environmental impact for relatively high-end applications, i.e., nanoelectronics and transparent electrodes, for which graphene is currently regarded as an important component. The second goal is to enable potential applications, i.e., disposable electronics, textiles, conformable biomedical devices, and thin-film photovoltaic modules that would be difficult to realize using graphene at its current cost. In the well-known, roll-to-roll-compatible process originally described by Bae et al., (Bae, S., et. al., S. Nat. Nanotechnol. 2010, 5, 574.) single-layer graphene was grown on large-area copper foils by chemical vapor deposition (CVD) and released onto a carrier substrate by chemical etching of the copper. This process is significant in its ability to produce films over large areas, but the cost of a one-atom-thick layer of graphene includes the destruction of an equal area of a seventy thousand-atom-thick copper foil, along with the economic costs and environmental externalities associated with handling large amounts of corrosive waste. Thus, there is a need for improved methods of synthesizing large areas of high-quality graphene.

SUMMARY

The present invention is based, at least in part, on the development of an environmentally benign and scalable process of transferring graphene to substrates (e.g., flexible, solid or rigid substrates). The process is based on the preferential adhesion of certain thin metallic films to graphene; separation of the graphene from the catalytic metal foil (e.g., copper foil or nickel foil) followed by lamination onto a flexible target substrate in a process that is compatible with roll-to-roll manufacturing. The metal foil (e.g., copper foil or nickel foil) substrate is indefinitely reusable and the method is substantially greener than the current process that uses corrosive iron (III) chloride to etch the metal (e.g., copper).

In one aspect, the disclosure provides a method of manufacturing a graphene layer on a substrate comprising providing a graphene layer disposed on a first substrate, applying a metal layer to the graphene layer to form a metalized graphene layer, removing (e.g., peeling, exfoliating) the metalized graphene layer from the first substrate, and applying (e.g., laminating) the metalized graphene layer to a second substrate. In some aspects, the method further comprises removing a thermal release adhesive tape from the metal layer.

The process of providing the graphene layer disposed on a first substrate can comprise providing a first substrate, followed by growing the graphene layer on the first substrate layer using a chemical vapor deposition process. The first substrate can be a metal foil (e.g., a catalytic metal foil) selected from a copper foil, a nickel foil, or any other metal foil material capable of supporting graphene deposition via a chemical vapor deposition process. In some embodiments, the first substrate comprises copper, nickel, or an alloy thereof.

In some embodiments, the graphene layer is a monolayer. In other embodiments, the graphene layer comprises two or more graphene layers.

In some aspects, the methods disclosed herein include a process of applying a metal layer to the graphene layer. The process of applying the metal layer to the graphene layer can be completed by a vacuum metallization process or an electrochemical metallization process. In some aspects, the vacuum metallization process is selected from the group consisting of electron beam evaporation, thermal evaporation and sputtering. In some aspects, the electrochemical metallization process is selected from the group consisting of an electroplating process, electroless deposition and atomic layer deposition. In some embodiments, the metal layer applied to the graphene layer comprises gold, nickel, cobalt, iron, silver, copper, tin, palladium, platinum, alloys thereof, or combinations thereof. In some other embodiments, the metal layer applied to the graphene comprises a transition metal or alloy thereof (e.g., scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, hafnium, tantalum, tungsten, rhenium, osmium, iridium, platinum, gold and mercury). For example, at least one metal or alloy selected from cobalt and nickel may be used. In exemplary embodiments, the metal layer comprises nickel, cobalt or gold. The metal layers applied to the graphene layer can have a thickness of about 1 to about 1000 nanometers (nm), about 20 nm to about 1000 nm, about 50 nm to about 750 nm, about 100 nm to about 500 nm, about 125 nm to about 250 nm, or about 150 nm to about 200 nm. For example, the metal layer can be applied to the graphene at a thickness of about 20 nm to about 1000 nm, about 50 nm to about 750 nm, about 100 nm to about 500 nm, about 125 nm to about 250 nm, about 150 nm to about 200 nm, about 75 nm, about 100 nm, about 125 nm, about 150 nm, about 175 nm or about 200 nm.

In some embodiments, the metal layer applied to the graphene layer comprise two or more sequentially deposited metal layers. For example, the metal layer applied to the graphene layer may comprise two or more sequentially deposited metal layers, the metal layers comprising a transition metal or alloy (e.g., scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, hafnium, tantalum, tungsten, rhenium, osmium, iridium, platinum, gold and mercury). For example, at least one metal or alloy selected from cobalt and nickel may be used. In exemplary embodiments, the metal layer comprises nickel, cobalt or gold. The two or more sequentially deposited metal layers can have a thickness of about 1 to about 1000 nanometers (nm), about 20 nm to about 1000 nm, about 50 nm to about 750 nm, about 100 nm to about 500 nm, about 125 nm to about 250 nm, or about 150 nm to about 200 nm. For example, individual metal layers can have a thickness of about 20 nm to about 1000 nm, about 50 nm to about 750 nm, about 100 nm to about 500 nm, about 125 nm to about 250 nm, about 150 nm to about 200 nm, about 75 nm, about 100 nm, about 125 nm, about 150 nm, about 175 nm or about 200 nm.

In some aspects, the methods disclosed herein include a process for exfoliating the metalized graphene layer from the first substrate. In some embodiments, the process for exfoliating the metalized graphene layer from the first substrate comprises adhering an intermediary substrate to the metal, and applying force to the intermediary substrate sufficient to overcome the interaction between the first substrate and the graphene layer to remove the metallized graphene from the first substrate. The intermediary layer can be thermal release adhesive tape, a further metal (magnetic) layer, or comprise a conducting or insulating layer. The thermal release adhesive tape is applied to the metal layer using a roller to apply the thermal release adhesive tape from one edge of the metal layer to the opposite edge of the metal layer. In some embodiments, the exfoliation process comprises removing the intermediary layer from the metal layer (e.g., removing the thermal release adhesive tape, metal (magnetic) layer, conducting layer or insulating layer). In some aspects, the methods disclosed herein include a step of applying a layer of thermal release adhesive tape directly upon the metal layer disposed on the graphene layer. The thermal release adhesive tape can be applied to the metal layer by hand or using a roller (e.g., a roll-to-roll transfer method), wherein the roller applies the thermal release adhesive tape from one edge of the thermal release adhesive tape to the opposite edge of the thermal release adhesive tape.

In some aspects, the methods disclosed herein further comprise removing the metal layer from the graphene layer following lamination of the graphene layer to the second substrate. In one embodiment, the methods disclosed herein comprise etching the metal layer to remove the metal layer from the graphene layer.

In some aspects, the disclosure provides methods for transferring a graphene layer to a flexible substrate, the methods comprising providing a graphene layer, applying a metal layer to the graphene layer to form a metalized graphene layer, applying a thermal release adhesive tape to the metal layer, and laminating the metalized graphene layer to the flexible substrate. According to some aspects, the method further comprises removing the metal layer from the graphene layer following lamination of the metalized layer to the flexible substrate.

Unless otherwise defined, all technical and scientific terms used herein have the same meaning as commonly understood by one of ordinary skill in the art to which this invention belongs. Methods and materials are described herein for use in the present invention; other, suitable methods and materials known in the art can also be used. The materials, methods, and examples are illustrative only and not intended to be limiting. All publications, patent applications, patents, sequences, database entries, and other references mentioned herein are incorporated by reference in their entirety. In case of conflict, the present specification, including definitions, will control.

Other features and advantages of the invention will be apparent from the following detailed description and figures, and from the claims.

DESCRIPTION OF DRAWINGS

The patent or application file contains at least one drawing executed in color. Copies of this patent or patent application publication with color drawing(s) will be provided by the Office upon request and payment of the necessary fee.

DETAILED DESCRIPTION

This disclosure is based, in part, on the discovery of a new environmentally benign and scalable process of transferring graphene to flexible substrates. The process is based on the preferential adhesion of certain thin metallic films to graphene, exfoliation of the graphene from a metal foil substrate used as a substrate for growing graphene, followed by lamination of the graphene layer to a flexible target substrate using a thermally deactivated adhesive in a process that is compatible with roll-to-roll manufacturing. The metal foil substrate (e.g., a copper foil substrate) is indefinitely reusable and the method is substantially greener than the current process that uses corrosive chemical solutions to etch the metal foil. The quality of the graphene produced by this new process is similar to that produced by the standard method, given the defects observable by Raman spectroscopy. Green and inexpensive syntheses of high-quality single-layer graphene will enable applications in flexible, stretchable, and disposable electronics, low-profile and lightweight barrier materials, and in large-area displays and photovoltaic modules that are inaccessible to the current expensive and environmentally deleterious methods for generating this versatile material.

In one aspect, the disclosure provides a Metal-Assisted Exfoliation (MAE) process for large-area transfer of single-layer graphene from catalytic metal substrates to flexible sheets comprising preferential adhesion of a metal layer to graphene, exfoliation, and lamination mediated by tape with a thermally deactivated adhesive.

The term "thermally deactivated adhesive" and "thermal release adhesive" are used interchangeably and refer to an adhesive that can be deactivated upon exposure to heat, e.g., exposure to a temperature of at least 80° C., at least 85° C., at least 90° C., at least 95° C., at least 100° C., at least 105° C., at least 110° C., at least 115° C., at least 120° C., at least 130° C., at least 140° C., at least 150° C., or at a temperature between about 80° C. and about 150° C., a temperature between about 90° C. and about 140° C. a temperature between about 100° C. and about 130° C., or a temperature between about 110° C. and about 120° C. Accordingly, selectively applied heat will modify the thermally deactivated adhesive, eliminating or substantially reducing the adhesion between the tape and a substrate. The term "thermal release tape" refers to a tape comprising at least one adhesive layers comprising a thermally deactivated adhesive.

Figure 1:
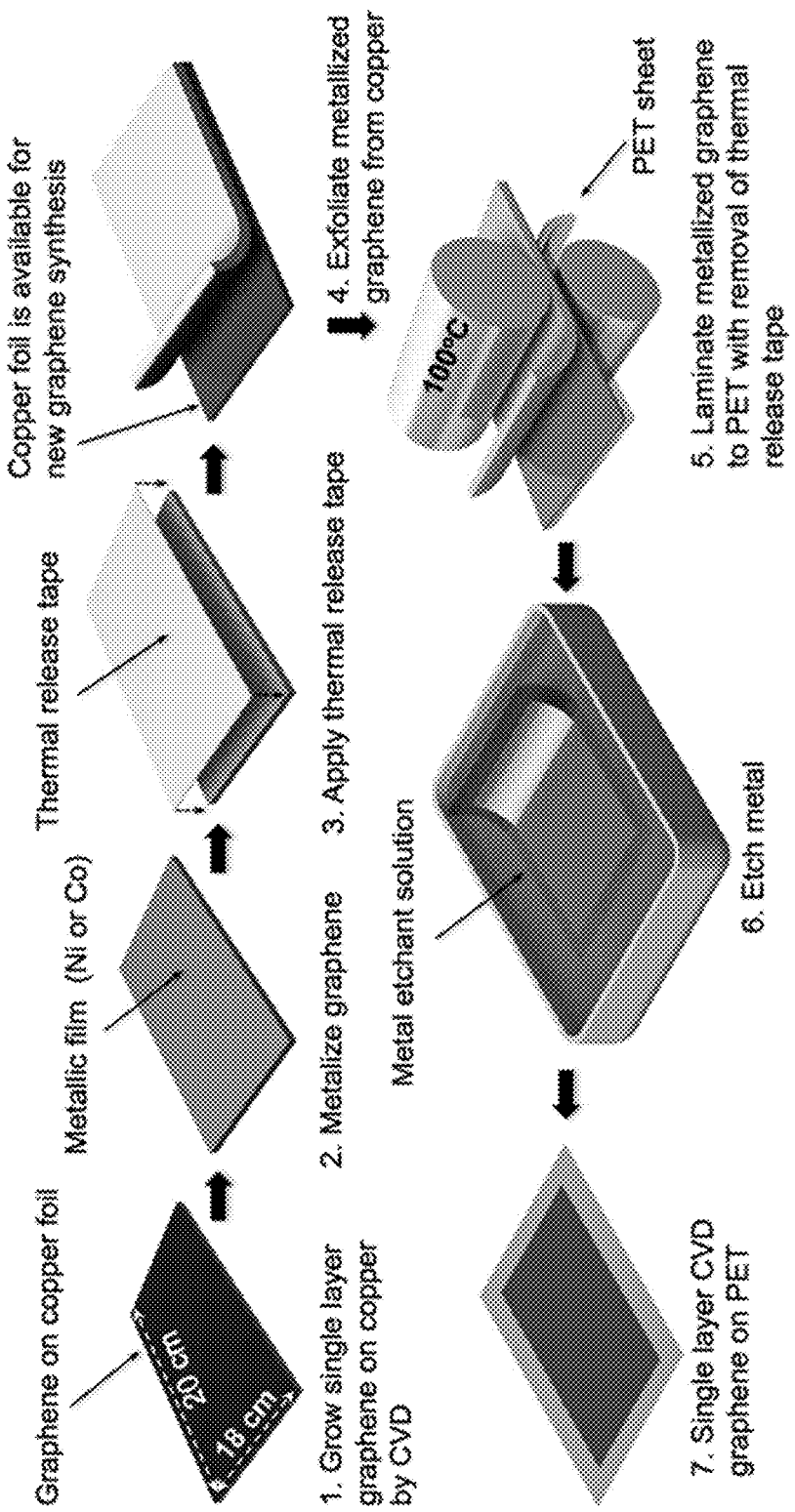
FIG. 1 is a schematic diagram demonstrating an exemplary Metal-Assisted Exfoliation (MAE) process for large-area transfer of single-layer graphene from catalytic copper substrates to flexible sheets comprising preferential adhesion of a metal (e.g., nickel or cobalt) layer to graphene, exfoliation of the metallized graphene, and lamination mediated by tape with a thermally deactivated adhesive.

FIG. 1 provides exemplary steps for a Metal-Assisted Exfoliation (MAE) process according to the invention for large-area transfer of single-layer graphene growth via a chemical vapor deposition (CVD) process to polyethylene terephthalate (PET) sheets comprising preferential adhesion of nickel (or cobalt) to graphene, exfoliation, and lamination mediated by tape with a thermally deactivated adhesive. Briefly, a single graphene layer was grown on a metal foil substrate by ambient pressure CVD (FIG. 1, step 1). While processes described herein comprise forming a single graphene layer (e.g., a graphene monolayer), the methods include forming multiple layers of graphene (e.g., more than one, more than two, more than fifty, more than one hundred, more than one thousand, more than one hundred thousand layers of graphene) on the substrate.

Growth of the graphene layer on the metal foil can be accomplished using the chemical vapor deposition (CVD) process known to those of skill in the art. For example, the graphene may be deposited using rapid thermal chemical vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD), plasma-enhanced chemical vapor deposition (PECVD), or the like.

CVD has emerged as the method of choice for large area production of monolayer graphene. In the CVD process, graphene is deposited at relatively high temperatures, between 600 and up to 1100° C., on a metal substrate (i.e., a metal foil). Example metals for use as metal substrate include copper (Cu), nickel (Ni), platinum (Pt) and iridium (Ir), though any metal is suitable for supporting the formation of graphene film. The use of CVD in combination with copper catalysts has enabled the relatively large-scale production of monolayer graphene. The CVD reaction can be undertaken using different types of CVD equipment such as cold walled and hot walled reactors. During the deposition process a carbon source solid, liquid or gas is inserted into the reaction chamber. At high temperatures between 600 and up to 1100° C., graphene is formed on the metal catalyst surface. Graphene deposition can be done at atmospheric pressure or under vacuum. Among the advantages of using copper foils are their very low cost, flexibility and easy handling. The copper catalyst can be in the form of thin films on top of silicon substrates or thicker films in the form of foils. Graphene can be deposited on copper foils of varying thicknesses ranging from 10 μm up to 1000 μm.

The first substrate (e.g., metal substrate) can be a metal foil (e.g., a catalytic metal foil) selected from a copper foil, a nickel foil, or any other metal foil material capable of supporting graphene deposition via a chemical vapor deposition process. The first substrate (e.g., metal substrate) may include at least one metal or alloy selected from copper (Cu), nickel (Ni), cobalt (Co), iron (Fe), platinum (Pt), gold (Au), ruthenium (Ru), aluminum (Al). For example, at least one metal or alloy selected from Cu and Ni may be used.

In some aspects, the methods disclosed herein include a process for metalizing the graphene layer by depositing (e.g., applying) a metal layer (e.g., film) on the graphene by physical vapor deposition (FIG. 1, step 2). The process of applying the metal layer to the graphene layer can be completed by a vacuum metallization process or an electrochemical metallization process. Metallization of graphene can be accomplished using methods familiar to those of skill in the art, including vacuum metallization techniques (e.g., electron beam evaporation, thermal vaporization or sputtering) or electrochemical metallization techniques (electroplating (an electrical potential is applied between the graphene on copper (cathode) and a metallic anode in the electrolyte solution containing the anodic metal ions); electroless deposition (deposition of metal out of solution due to a chemical reduction reaction on the cathode (graphene on copper); or atomic layer deposition (controlled deposition on mono-atomic layers of material by sequentially controlled chemical reactions)). The metal layer deposited on the graphene can be, for example, nickel, cobalt, gold, iron, aluminum, silver, copper, tin, palladium, platinum, or combinations thereof. For example, at least one metal or alloy selected from Co and Ni may be used. In exemplary embodiments, the metal layer comprises nickel or cobalt. In some embodiments, the metal layer deposited on the graphene can be between about 20 nm to about 1000 nm thick (e.g., between about 50 nm to about 750 nm, between about 100 nm to about 500 nm, between about 125 nm to about 250 nm, between about 150 nm to about 200 nm, or about 75 nm, about 100 nm, about 125 nm, about 150 nm, about 175 nm or about 200 nm thick).

In some aspects, the methods disclosed herein include a step of removing (e.g., exfoliating) the metalized graphene layer from the first substrate. The metalized graphene layer can be removed from the first substrate by peeling the metalized graphene layer away from the first substrate. The exfoliation may be performed by adhering the metallized graphene to the intermediary substrate (via: van Der Waals forces, magnetic force, pressure differential, electrostatic force, or any combination thereof, etc.), applying force to the intermediary substrate sufficient to overcome the first substrate (e.g., copper)/graphene interaction, thus effectively exfoliating the metallized graphene from first substrate. Further, the exfoliated graphene can be laminated onto the final receiving substrate (e.g., the second substrate) and the intermediary substrate can be disengaged from the metallized graphene by terminating the van Der Waals bonds, electrostatic force, magnetic force or pressure differential.

Examples of using van Der Waals forces include, for example, the use of thermal release tape, scotch tape, polydimethylsiloxane, and the like.

Example of using the electrostatic force includes, for example, metallized graphene on first substrate being pressed against the intermediary substrate consisting of a conducting layer and an insulating layer. An electric bias is applied across the insulating layer between the metallized graphene and the conducting layer of the intermediary substrate. The bias generates an attractive electrostatic force between the metallized graphene and the conductive layer, sufficiently large to overcome the first substrate/graphene interaction potential. After the exfoliation of the metallized graphene from the first substrate, the intermediary substrate housing the metallized graphene is laminated with the final receiving substrate (e.g., the second substrate) and the electric bias is discontinued thus releasing the laminated metallized graphene from the intermediary substrate.

Example of using a pressure differential includes, for example, the metallized graphene on copper being pressed against a porous intermediary substrate (ex: nano-porous alumina plate, etc.). A pressure differential is applied across the plate, thus creating vacuum suction on the metallized graphene on first substrate, sufficient to overcome the first substrate/graphene interaction during exfoliation. Upon exfoliation, the intermediary substrate housing the metallized graphene is laminated with the final receiving substrate (e.g., the second substrate) and the vacuum suction discontinued, thus releasing the intermediary substrate.

Example of using the magnetic force includes, for example, a magnetized intermediary substrate being pressed against the metallized graphene on the first substrate (e.g., copper). In the case that the metallizing material is ferromagnetic in nature, a magnetic field causes metallic film magnetization and results in the magnetic force between the metallized graphene and the intermediary substrate, sufficient to overcome the first substrate/graphene interaction during exfoliation. Upon exfoliation, the metallized graphene on the intermediary substrate is laminated with the final receiving substrate (e.g., the second substrate) and the magnetic field discontinued, resulting in the release of the intermediary substrate.

The aforementioned intermediary substrates can be planar or cylindrical and can accommodate batch or continuous roll-to-roll processes.

In some aspects, the methods disclosed herein include a step of applying (e.g., laminating) the metalized graphene layer to a second substrate. The second substrate can be a flexible solid, rigid, or fragile substrate. In some embodiments, the second substrate is a flexible substrate selected from the group consisting of polyethylene terephthalate (PET), polyimide, polyethylene naphthalate (PEN), polycarbonate (PC), an elastomer polymer, a chemical vapor deposition (CVD)-deposited polymer, and combinations thereof. The CVD-deposited polymer can be, for example, Parylene-C, Parylene-D or Parylene-N. In some embodiments, the second substrate is transparent.

The metalized graphene layer can be applied to the second substrate by hand or using a roller (e.g., a roll-to-roll transfer method). The lamination process is completed at a temperature range within which the adhesive of the adhesive thermal release tape is deactivated (e.g., between about 100° C. and 120° C.). In some embodiments, the laminating step and removing the thermal release adhesive tape are completed concurrently. Thus, upon lamination of the graphene surface to the second substrate, the metalized graphene bilayer detached from the adhesive thermal release tape and simultaneously attached to the second substrate.

In some aspects, the methods disclosed herein include a process for laminating an adhesive thermal release tape onto the metal layer (e.g., nickel, cobalt, gold, iron, aluminum, silver, copper, tin, palladium, platinum, or combinations thereof layer) formed on the graphene (FIG. 1, step 3). In some embodiments, the adhesive thermal release tape is applied by hand. The adhesive thermal release tape can be applied using a specific machine, such as a roller, to apply controlled pressure and speed, starting from one edge of the adhesive thermal release tape to the opposite edge, thus avoiding the formation of bubbles between the metal layer and the adhesive tape, and avoiding the need to apply the tape by hand. The application of the adhesive thermal release tape can be done at room temperature without the need to use a controlled atmosphere. Moreover, this method does not require sophisticated equipment or vacuum conditions for its implementation. Bulk standard equipment that can apply controlled pressure with a controlled speed is sufficient. The equipment is low cost; even a hand-operated process is sufficient. These adhesive tapes can be thermal or pressure sensitive tapes but preferably thermal release tapes. The adhesive thermal release tape can be polymeric. The composition of the adhesive polymer can be based on polyester type polymers such as polyvinyl acetate, polyethylene vinyl acetate, polyacrylates (polymethyl acrylate, polyethyl acrylate, polypropyl acrylate, polybutyl acrylate, etc.), polymethacrylates (polymethyl methacrylate, polyethyl methacrylate, polypropyl methacrylate, polybutyl methacrylate, polyhydroxyethyl methacrylate, etc.), etc. In some embodiments, the adhesive thermal release tape releases at a temperature between about 70° C. to about 140° C., between about 80° C. to about 130° C., between about 90° C. to about 120° C., between about 100° C. to about 110° C., about 70° C., about 80° C., about 100° C., about 110° C., about 120° C., about 130° C. or about 140° C.

Following application of the adhesive thermal release tape to the metal layer, the metal/graphene bilayer films is removed (e.g., exfoliated) from the first substrate (e.g., the metal substrate by peeling up the adhesive thermal release tape (step 4)). Following the removal of the metal/graphene bilayer films, the metal substrate (e.g., the copper substrate) is reusable for CVD without further treatment.

In some aspects, the methods disclosed herein include a process of applying (e.g., laminating) the metalized graphene layer to a second substrate. The second substrate can a flexible solid, rigid, or fragile substrate.

Referring to FIG. 1, lamination of the graphene to a substrate (i.e., the second substrate), bearing a thermoplastic adhesive coating, at 100° C. deactivated the adhesive on the thermal release tape, and the graphene remained on the flexible substrate (FIG. 1, step 5). The flexible substrate/graphene/metallic film was then dipped into the bath with metal etchant solution for 3-5 seconds (FIG. 1, step 6) and rinsed in deionized water to yield a substrate covered with single-layer graphene (FIG. 1, step 7).

In some embodiments, the second substrate is a flexible substrate. Flexible substrates include, for example, polyethylene terephthalate (PET), polyimide, polyethylene naphthalate (PEN), polycarbonate (PC), an elastomer polymer, and combinations thereof. By way of example, the elastomer polymer may be, but may not be limited thereto, transparent. By way of example, the elastomer polymer may include, but may not be limited thereto, polydimethylsiloxane (PDMS), poly(methylmethacrylate) (PMMA), or silicone rubber. In some embodiments, the flexible substrate may be, for example, a transparent flexible substrate.

In some embodiments, the second substrate is a rigid substrate, including, for example rigid substrates selected from group consisting of an oxide substrate including a glass substrate, a Si substrate, a $SiO_2$ substrate, an ITO substrate, and the like; a metal substrate; and combinations thereof. For non-limited example, the metal substrate may include at least one metal or alloy selected from copper (Cu), nickel (Ni), cobalt (Co), iron (Fe), platinum (Pt), gold (Au), ruthenium (Ru), aluminum (Al). For non-limited example, the oxide substrate may include, for example, an oxide substrate of metal having an insulating property, a conductive property, or a semiconductor property. The oxide substrate may include, for example, a $SiO_2$ substrate, an ITO substrate, a $SnO_2$ substrate, a $TiO_2$ substrate, and an $Al_2O_3$ substrate.

Advantageously, removal of the adhesive thermal release tape and lamination of the graphene substrate can be accomplished in a concurrent process as described below.

The graphene transferring processes according to the disclosure may be used both on flexible substrates, on rigid substrates and on fragile substrates.

The processes disclosed herein are scalable to accommodate large graphene films. In principle, there is no maximum limit in the graphene size other than the one given by the equipment used to attach the adhesive tape and the equipment used to produce the graphene. The equipment could be defined to be able to handle meter scale graphene films. Furthermore, this method can be easily integrated in an in-line, continuous or batch production process, making graphene industrial production viable. Thus, opening up the opportunity to market graphene based products.

Once the graphene is on the desired substrate the quality and uniformity can be assessed. The uniformity and homogeneity of the graphene can be evaluated using optical microscopy techniques when the graphene has been transferred onto silicon substrates that contain a 300 nm thermal oxide layer (Si/$SiO_2$). Additionally, the graphene quality can be determined using Raman spectroscopic techniques on the same substrates (Si/$SiO_2$).

In a further aspect, the processes disclosed herein include a process of patterning metallized graphene comprising a step of metal etching in the acidic bath, the metal can be patterned with a water-insoluble resist (polymer or another metal, or ceramic, etc.) via various patterning methods (soft lithography, nano-imprint lithography, photo lithography, screen printing, etc.). Such protective patterning of the metallic film can result in selective etching of the metallic film in the acid bath, resulting in a residual metallic pattern (where metal is protected by the resist) on top of the graphene. Further, the resist can be removed in the appropriate solvent. The result of this step is a PET sheet, covered with continuous graphene with metallic patterns (can be used in solar cells or OLEDs, where graphene is the continuous planarizing electrode and the metal patterns can be used as low-resistance electrodes).

Figure 6:
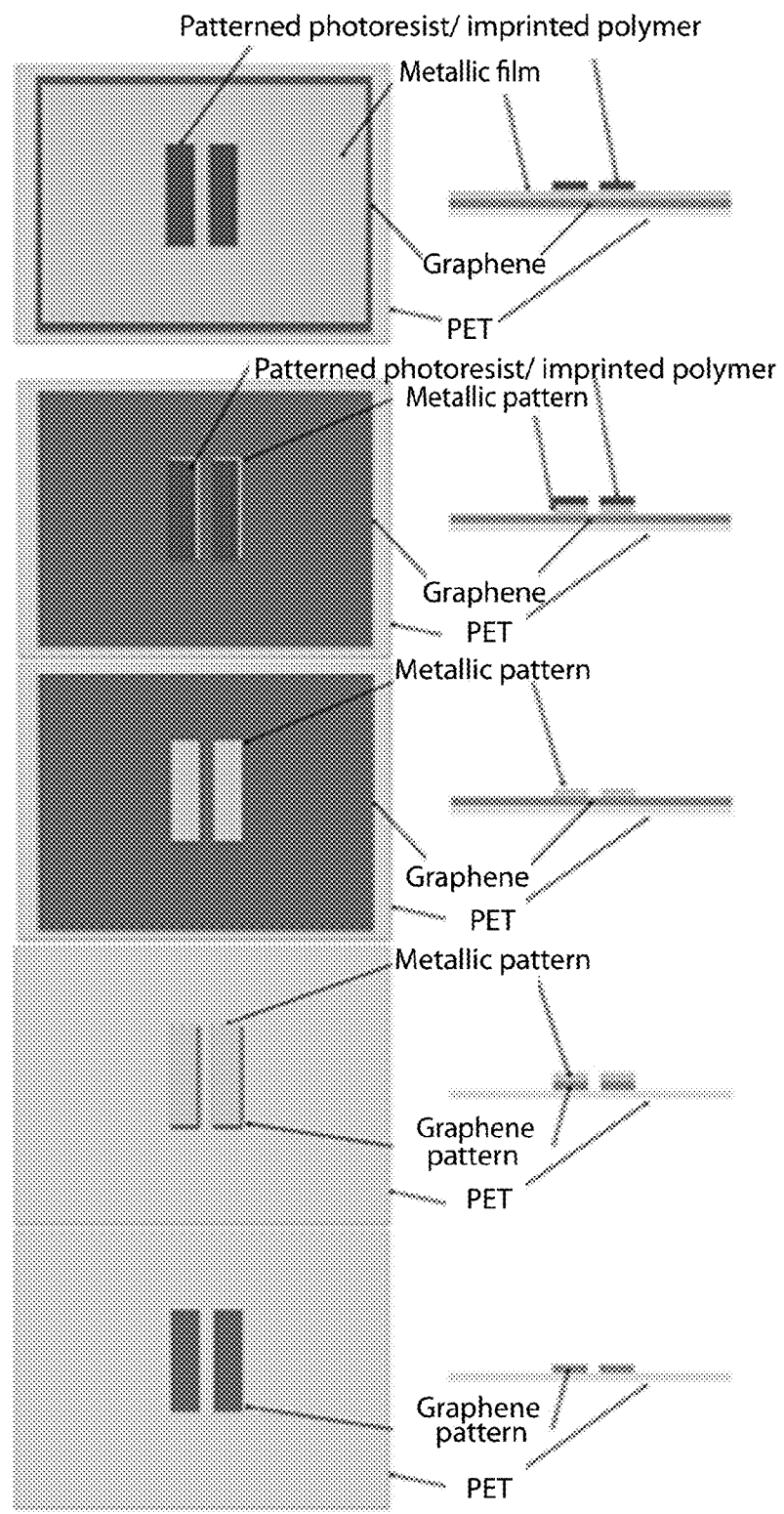
FIG. 6 is a schematic diagram demonstrating a process of patterning metallized graphene.

Alternatively, all-graphene transparent flexible circuit elements can be produced with an additional step of exposing this metallic patterned graphene to oxygen plasma (reactive ion etching, etc.) in order to remove the exposed (unpatterned) graphene. Further, the metal pattern can be dissolved in an acidic bath thus producing graphene patterns on PET. As demonstrated in FIG. 6, the process of patterning of metallized graphene includes (1) depositing a protective polymer pattern via imprint lithography, photo-lithography on the substrate/graphene/metal layer; (2) etching the metal in an acid solution; (3) removing the polymer from the etched substrate/graphene/metal layer in a solvent bath; (4) removing the graphene via plasma etching (e.g., reactive ion etching, etc.) from the substrate/graphene/metal layer; and (5) removing the metal in an acid solution leaving substrate/graphene pattern sandwich.

EXAMPLES

The invention is further described in the following examples, which do not limit the scope of the invention described in the claims.

Cleaning the Copper Foil.

Graphene was synthesized on 25-µm-thick copper foils (Alpha Aesar, 13382, 99.8%) with the dimensions of 10 cm×11 cm or 18 cm×20 cm. Prior to the growth of graphene, the copper foils were cleaned by soaking them in a shallow acetone bath and wiping them with a Kimwipe™ tissue (while in acetone). Then the foils were rinsed with acetone and transferred into a similar bath filled with isopropyl alcohol (IPA), and mechanical cleaning was repeated in this solvent. The inventors note that the mechanical cleaning resulted in more pristine graphene than after cleaning the foils via sonication in acetone and IPA[1]; this method also saved a considerable amount of both solvents (considering the large volumes required for sonicating large-area copper foils). After the mechanical cleaning in IPA, the foils were rinsed in IPA and dried in a stream of compressed air.

Electropolishing the Copper Foil.

To generate mostly single-layer graphene, the copper foils were electropolished prior to graphene synthesis[1,2]. The clean, dry copper foil was placed into a 250-mL beaker, following the contours of the beaker side-walls, and was used as the anode. A copper pipe (d=2.54 cm, l=15 cm) was inserted into the beaker along the cylindrical axis and used as the cathode. The cylindrical shape of the cathode and the curved surface of the anode generated a uniform electric field during the electropolishing. Concentrated phosphoric acid ($H_3PO_4$, 15 M) was used as the electrolyte and was poured into the beaker after the cathode and the anode were secured with a clamp and an alligator clip respectively. A 20 W DC power supply was used to generate the necessary current and voltage. The voltage was set at 1.6 V and electropolishing proceeded until the current fell 50% from the initial value and plateaued (usually between 5-10 min). After the electropolishing, the cathode and the electrolyte were removed from the beaker and the copper foil was extensively rinsed with DI water (3 min). Then the copper foil was rinsed with IPA, blow-dried under a stream of compressed air, and immediately loaded into the middle of the quartz tube of a chemical vapor deposition (CVD) reactor.

Synthesis of Graphene.

Atmospheric-pressure CVD graphene synthesis was performed in a quartz tube furnace (MTI OTF-1200X-HVC-UL) with the following tube dimensions: d=7.6 cm, l=100 cm. The CVD chamber and the reactor gas-supply lines were purged of air for 5 min by flowing a mixture of all synthesis gases (hydrogen, methane, and argon) at their maximum flow rates while pulling vacuum on the chamber with a diaphragm vacuum pump. After 5 min, the gas flow was stopped and the chamber was evacuated to about 10-4 torr with a turbomolecular vacuum pump in order to remove methane and hydrogen from the gas-mixing and the reactor chambers, as well as to desorb the possible organic contaminants from the surface of the copper foil. The chamber was then re-pressurized to atmospheric pressure with ultra-high purity argon (700 SCCM), which flowed constantly throughout the entire procedure of graphene synthesis. The copper foils were heated in argon flow to 1050° C. (30 min). Upon reaching this temperature, additional hydrogen (60 SCCM) was flowed for 30 min to anneal and activate the copper substrate. After 30 min of annealing, the flow rate of hydrogen was reduced to 5 SCCM and 0.7 SCCM of methane was flowed for 20 min for the synthesis of graphene (total gas flow rate: 700 SCCM argon+5 SCCM hydrogen+0.7 SCCM methane=705.7 SCCM). After 20 min of graphene growth, the furnace was turned off and cracked open 5 cm (continuing the same gas flow). When the furnace cooled to 700° C. (ca. 5 min) it was opened to 10 cm. At 350° C. (ca. 30 min), the furnace was completely opened. At 200° C., the hydrogen and methane flows were cut off and the reactor chamber was allowed to cool to room temperature with the argon flow (total cooling time was approximately 1 h).

Electron-Beam Evaporation.

A Temescal BJD-1800 e-beam evaporator was used to metallize the graphene on the copper foil with a 150-nm film of nickel, cobalt, gold, iron, or aluminum. The metal evaporation rate was 2 Å s$^{-1}$ and the chamber pressure was kept at 7×10$^{-7}$ torr.

Application of Thermal Release Tape.

Nitto Denko Revalpa 3196 thermal release tape was manually laminated to the metallized (e.g., nickel) graphene on the copper foil. The flat side of wafer tweezers was used to remove the air bubbles that formed between the adhesive and the metal film (the presence of bubbles caused incomplete graphene exfoliation and gave rise to cracks in the metal film due to the high strains they impose on the films). Further, the copper foil was peeled from the thermal release tape and immediately placed into the chamber of the CVD reactor under ultra-high vacuum until the next graphene synthesis. The peeling away of the copper foil resulted in the exfoliation of metallized graphene and its attachment to the thermal release tape Concurrent Removal of the Thermal Release Tape and Lamination to PET.

A commercial office laminator (intended for laminating paper between plastic sheets) and polyethylene terephthalate (PET) pouches (Office Depot, 125-μm), whose interior surfaces bare a thermally-activated coating, were used to laminate the exposed graphene surface. The laminator operated at temperatures between 100° C. and 120° C. (the range in which the adhesive of the thermal release tape deactivated). Thus, upon the lamination of the graphene surface, the graphene/metal bilayer film detached from the thermal release tape and simultaneously attached to the PET.

Etching the Sacrificial Metallic Film.

A solution of iron(III) chloride (FeCl$_3$, 1 M) was used to remove the metallic film from the surface of the graphene. An immersion of 3-5 s in the FeCl$_3$ bath was sufficient to completely remove the 150-nm nickel film (compared to 20-30 min needed to etch away the 25-μm copper foil in the conventional wet-transfer method). After etching the metal, the PET/graphene film was rinsed in running DI water for 5 min to remove the etchant.

Transferring Graphene Using the Conventional Wet-Transfer Method[3].

For the conventional wet-transfer of graphene onto Si/SiO$_2$, the copper foil bearing a film of CVD-grown graphene was spin-coated with a 2.5% w/w solution of Poly (methylmethacrylate) (PMMA) in toluene at 4000 rpm for 60 s. After spin-coating, the exposed graphene on the side of the copper foil opposite the PMMA was etched using an oxygen plasma cleaner (30 s, 30 W, 200 mtorr oxygen pressure). Next, the PMMA/graphene coated copper foil was floated in a bath of 1M iron(III) chloride (FeCl3) for 30 min in order to etch the copper. To remove residual etchant, the free-floating PMMA-supported graphene was transferred three times into deionized water baths. The PMMA-supported graphene was subsequently transferred onto a 2.5 cm×2.5 cm piece of a silicon wafer bearing a 90 nm thermally grown oxide. After drying at room temperature for 5 h, the silicon wafer chip was placed into a boiling acetone bath for 30 min to remove the PMMA.

Raman Spectroscopy.

A Renishaw micro-spectroscope (532 nm laser) was used to obtain the Raman spectra of graphene on all substrates (no graphene spectra were obtainable on PET substrate).

Sheet Resistance Measurements.

A Keithley 2400 sourcemeter equipped with a 4-point probe (0.5 mm probe tip radius, 1 mm spacing between the tips) was used to measure the sheet resistance ($R_s$) of the PET/graphene sheets. Since the sizes of the graphene sheets were at least an order of magnitude greater than the spacing between the probes, we approximated the sizes of the sheets as infinite, and we used the standard multiple of 4.53 to convert the measured resistance to the sheet resistance, $$R_s = \frac{V}{I} 4.5324.$$

The quality of the graphene produced by the processes described herein is similar to that produced by the standard method, given the defects observable by Raman spectroscopy. The high-quality single-layer graphene synthesis methods disclosed herein enable applications in flexible, stretchable, and disposable electronics, low-profile and lightweight barrier materials, and in large-area displays and photovoltaic modules that are inaccessible to expensive and environmentally deleterious methods for generating this versatile material.

Example 1

Figure 2:
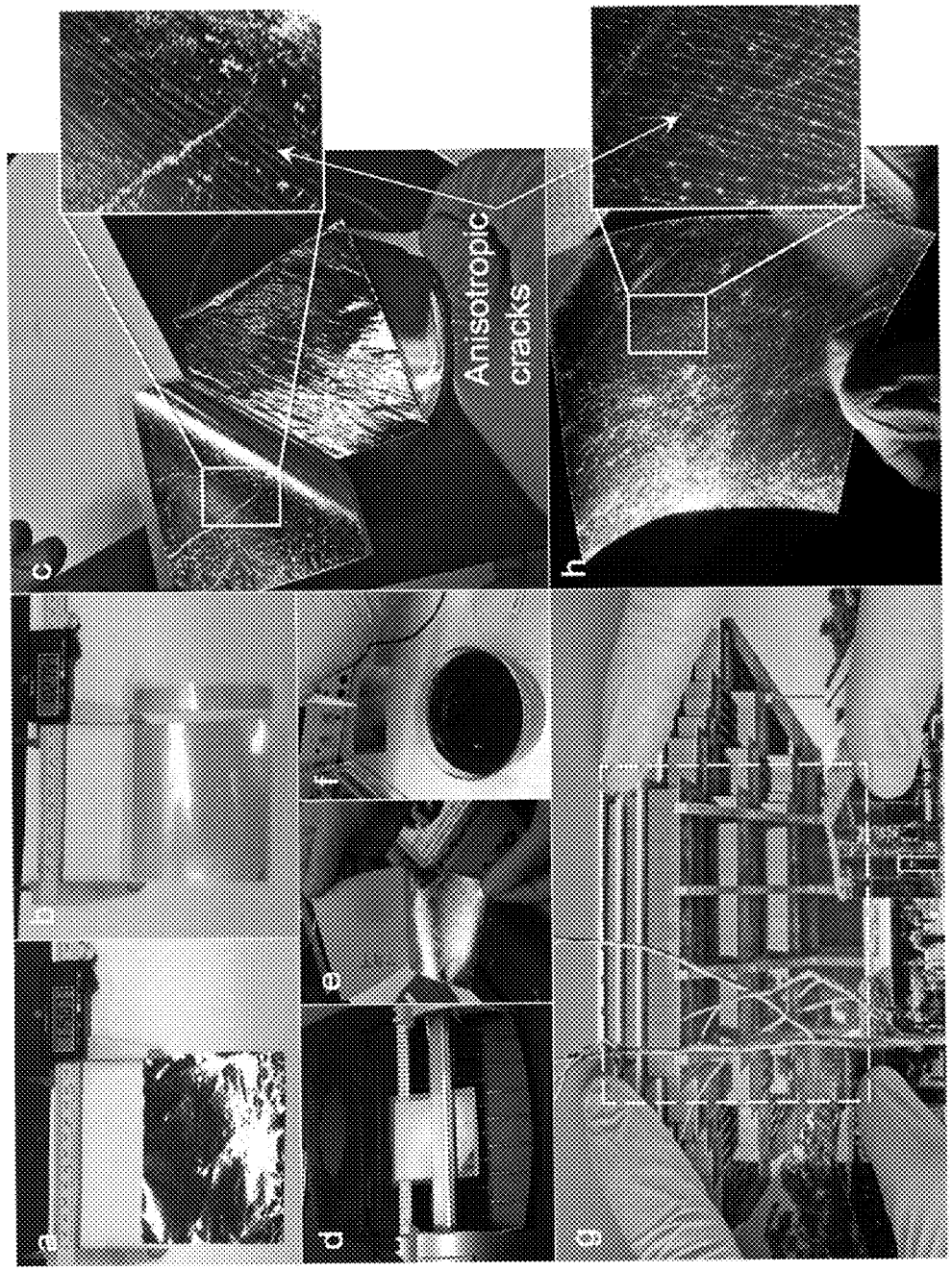
FIGS. 2a-h are photographs showing consecutive steps of an exemplary MAE process for large-area transfer of single-layer of graphene. Single layer graphene on a copper foil after: (a) nickel metallization, (b) thermal release tape application, (c) peeling of metallized graphene off of the copper foil. (d) lamination of a polyethylene terephthalate (PET) sheet to the metallized graphene (thermal release tape deactivates), (e) removal of the thermal release tape from the PET/graphene/nickel sheet, (f) dipping the PET/graphene/nickel sheet into the iron (III) chloride solution (3-5 seconds). PET sheet coated with single layer graphene (g) against a postcard with the UCSD Geisel library (the outline of the PET/graphene sheet is indicated by the box), (h) illuminated with low-angle incident light. The insets in (c) and (h) depict the anisotropic cracks that formed in the metallic film during the peeling of the thermal release tape/metallic film/graphene sheet from the copper foil.

A schematic diagram demonstrating of a graphene transfer method according to an embodiment of the invention is provided in FIG. 1. The process is based on the differential adhesion of graphene to different metals, subsequent mechanical exfoliation, and lamination to a flexible substrate using a thermally deactivated adhesive (FIG. 1). Briefly, a single-layer graphene was grown on a copper foil by ambient-pressure CVD (FIG. 1, step 1). A 150-nm film of nickel (or cobalt) was deposited on the graphene by physical vapor deposition (FIG. 1, step 2 and FIG. 2a). Thermal release tape was applied (FIG. 1, step 3 and FIG. 2b); peeling up the thermal release tape exfoliated the metal/graphene bilayer films from the copper substrate (FIG. 1, step 4 and FIG. 2c), which was reusable without further treatment. Lamination of the graphene to a commercial polyethylene terephthalate (PET) substrate, bearing a thermoplastic adhesive coating, at 100° C. deactivated the adhesive on the thermal release tape, and the graphene remained on the plastic substrate (FIG. 1 step 5 and FIG. 2d, e). The sheet containing PET/graphene/metallic film was then dipped into the bath with metal etchant solution for 3-5 seconds (FIG. 1, step 6 and FIG. 2f) and rinsed in deionized water to yield a sheet of PET covered with single-layer graphene (FIG. 1, step 7 and FIGS. 2g and 2h). The receiving substrate, PET, was selected for its widespread use in flexible electronics.

For these studies, graphene was successfully exfoliated from the copper foil using films of nickel, cobalt, and gold. A comparative density-functional study of the binding energies between graphene and various metal surfaces by Hamada and Otani revealed a stronger preference of graphene to nickel (141 meV) than to copper (62 meV).[12] The strong adhesion of nickel to graphene was also exploited by Kim et al. in a two-step exfoliation of graphene from SiC surfaces, but this process is not likely to be compatible with roll-to-roll manufacturing, because of the inflexibility of the SiC wafers.[13] In addition to the metals listed above, the inventors also attempted MAE with iron and aluminum, but found they did not exhibit preferential adhesion to graphene and thus did not enable exfoliation of graphene from the copper substrate. Of the three metals that enabled exfoliation, only nickel and cobalt could be etched without damaging the graphene (i.e., by etching it or rendering it non-conductive). For example, etching gold with the standard solution containing iodine and potassium iodide rendered the graphene non-conductive.

To determine the quality of the graphene transferred using the processes described herein, the sheet resistance (Rs) and the ratio of the D/G peak from the Raman spectra was measured. The obtained values of Rs varied within an order of magnitude between samples. Without being bound to theory, it is believed that the variability, in part, can be attributed to the manual nature of the transfer of the nickel/graphene or cobalt/graphene bilayer films to the thermal release tape. The lowest value of Rs obtained was 163 $\Omega sq^{-1}$ compared to the lowest value of 325 $\Omega sq^{-1}$ obtained from graphene transferred using the standard method in which the copper was etched. Some cracks were observed in the nickel film after exfoliation (FIG. 2c), which can be attributed, again, to the manual nature of the exfoliation step, along with the inability of the nickel or cobalt film to accommodate the tensile strain imposed on it during the peeling process. These cracks, which probably propagated through the graphene (FIG. 2h), produced an anisotropic sheet resistance; the average Rs measured parallel to the cracks (850±250 $\Omega sq^{-1}$) was an order of magnitude lower than when measured perpendicular to the cracks (8000±2000 $\Omega sq^{-1}$). An automated process, where the metallized graphene film is subject to reduced tensile strain by using rollers with large radii of curvature, or by using a stiffer adhesive, could reduce the occurrence of cracking. It is possible that kinetically controlled transfer printing by a reusable stamp, as described by Rogers and coworkers, would permit transfer without using thermal release tape.[14]

Figure 3:
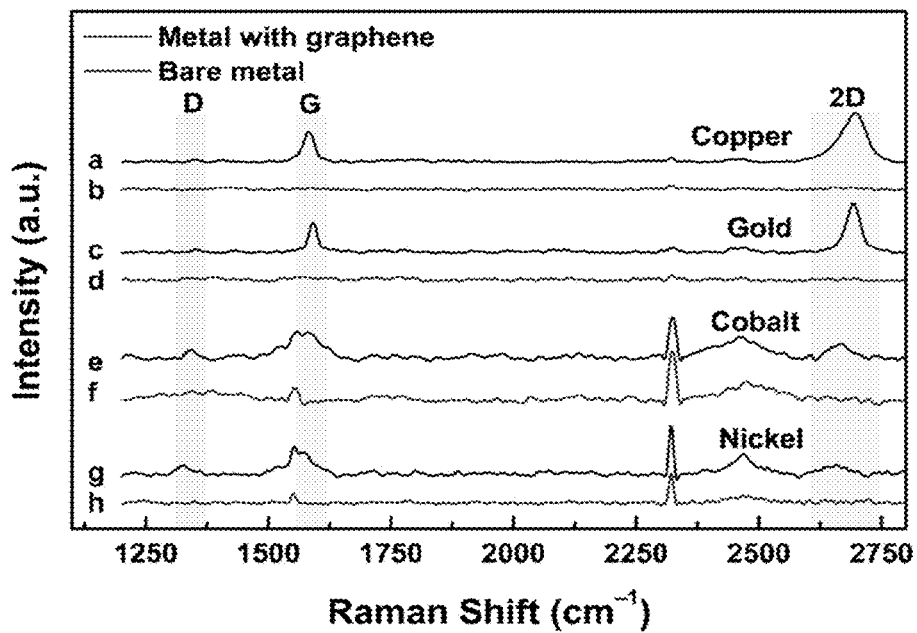
FIG. 3 is a graph demonstrating Raman spectra of (a) graphene as grown on copper foil, (b) copper foil after metal-assisted graphene exfoliation (no graphene peaks indicate a complete graphene removal from the copper foil), (c, e, g) graphene on metallic films transferred via the metal-assisted exfoliation from copper and (d, f, h) the pure metal films respectfully (gold and copper substrates significantly enhance the Raman scattering and produce strong, well-defined graphene peaks—highlighted in gray (e.g., D, G, 2D)—as compared to cobalt and nickel).
Figure 4:
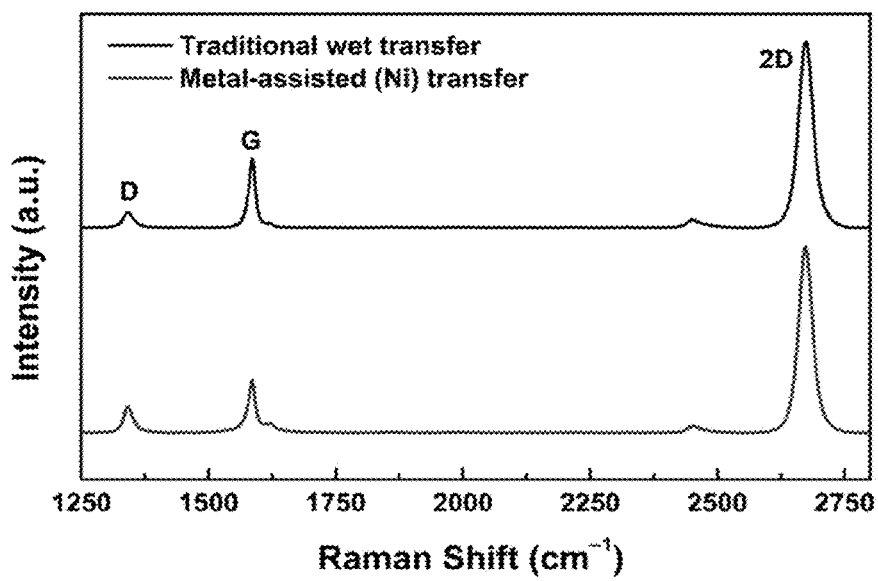
FIG. 4 is a graph demonstrating Raman spectra of graphene transferred to $Si/SiO_2$ by traditional wet-transfer method (upper spectra) and metal-assisted (Ni) method (lower spectra).

The Raman spectra of the graphene as grown on copper and after exfoliation are shown in FIG. 3. The spectra reveal the complete removal of graphene from copper in the exfoliated region. FIG. 4 provides a direct comparison of the defects present in the graphene produced by the prevailing method of wet-transfer described by Bae et al. to that produced by the MAE process.[4] To obtain these spectra, the graphene produced by both processes were laminated to a Si/SiO$_2$ substrate. For the traditional wet-transfer, this was achieved by spin-coating poly(methylmethacrylate) (PMMA) on top of graphene and etching the copper substrate. For the Raman spectroscopy of the MAE sample, epoxy was cured on top of the metallized graphene and it was then peeled off of the copper foil. PMMA was spin-coated on top of the exposed surface of graphene and the underlying nickel film was etched in FeCl$_3$. The freestanding graphene/PMMA was then transferred to DI water three times before applying it to the Si/SiO$_2$ wafer chip. The PMMA was then removed by submersion in a boiling acetone bath.

The quality of graphene was judged on the basis of the ratio of the D/G peaks (at 1330 cm$^{-1}$ and 1580 cm$^{-1}$) in the Raman spectra. Compared to the traditional wet-transfer process, the D/G peak ratio in the MAE process was increased by a factor of two (from 0.23 for wet-transfer to 0.50 for MAE). It is possible that the increase in the D-peak in the graphene transferred by the MAE process is due to damage during the electron-beam evaporation of the nickel film, mechanical damage during the metal-assisted exfoliation, as well as damage during the following wet-transfer process.

Figure 5:
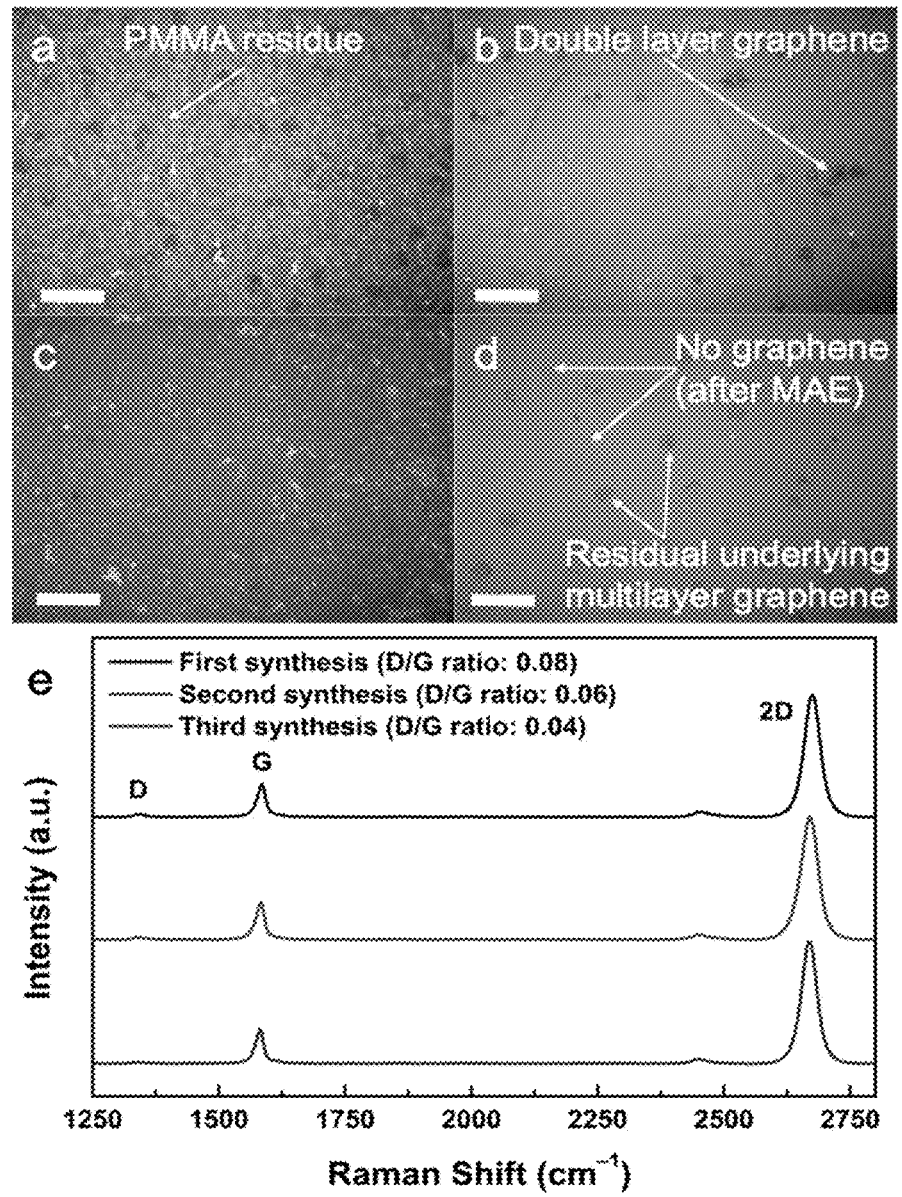
FIGS. 5a-e show optical micrographs of graphene transferred onto a $Si/SiO_2$ wafer from the same copper foil substrate after the first (a), second (b), and third (c) syntheses, using the traditional wet-transfer method. Each consecutive synthesis after the transfer of graphene via nickel evaporation produced cleaner, better quality graphene. That is, the number of multilayer regions, which appear in the images as darker spots, decreased significantly from (a) to (c). The white contamination visible in (a-c) is residual PMMA that could not be removed in the boiling acetone bath. Panel (d) represents the residual graphene grains (previously multilayer regions) on the copper substrate after exfoliation of graphene in the MAE process. (e) Raman spectra of the transferred graphene also indicated improvement in quality upon consecutive synthesis of graphene on the same substrate (the D/G peak ratio decreased from 0.08 in the first growth to 0.04 in the third growth).

The environmental benignity of the MAE process is predicated on the reusability of the copper foil used to grow the graphene. To determine the impact of reusing the same copper substrate on the growth of graphene, the inventors investigated the quality of the graphene grown on copper after cyclic growth and transfer. Remarkably, the quality of the graphene increased after successive cycles of growth (FIG. 5a-c, e). Without being bound to theory, it is believed that the increase in quality might be because of the additional annealing of the copper substrate during each cycle of graphene synthesis as well as the removal of surface contaminants with each metal-assisted graphene exfoliation, which produced a cleaner surface for subsequent growth (after each graphene exfoliation, the copper foil substrate was immediately placed into the CVD reactor chamber under ultra-high vacuum to avoid contamination of the surface).

After performing the metal-assisted exfoliation of graphene from the copper foil, the small amount of graphene remaining on the copper foil was transferred onto a Si/SiO$_2$ wafer using the traditional wet-transfer process for optical microscopy (FIG. 5d). The presence of residual individual graphene grains on the copper foil following MAE indicates that this process transfers predominantly the continuous top (metallized) layer of graphene and supports the theory that small patches of a second graphene layer form beneath the first layer, during graphene growth on copper by CVD.[16,17] Additionally, it is possible that these residual graphene grains serve as "seed grains" for the subsequent cycle of growth. It has been shown in literature that best quality CVD graphene on copper is obtained by "pre-seeding" graphene grains on the copper surface prior to graphene synthesis.[18]

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

REFERENCES (1) Coleman, K.; Edwards, R. S. Graphene synthesis: Relationship to applications. Nanoscale, 2012.
(2) van der Zande, A. M.; Barton, R. a; Alden, J. S.; Ruiz-Vargas, C. S.; Whitney, W. S.; Pham, P. H. Q.; Park, J.; Parpia, J. M.; Craighead, H. G.; McEuen, P. L. Nano Lett. 2010, 10, 4869.
(3) Schwierz, F. Nat. Nanotechnol. 2010, 5, 487.
(4) Bae, S.; Kim, H.; Lee, Y.; Xu, X.; Park, J.-S.; Zheng, Y.; Balakrishnan, J.; Lei, T.; Kim, H. R.; Song, Y. Il; Kim, Y.-J.; Kim, K. S.; Ozyilmaz, B.; Ahn, J.-H.; Hong, B. H.; Iijima, S. Nat. Nanotechnol. 2010, 5, 574.
(5) Song, W.; Li, D. W.; Li, Y. T.; Li, Y.; Long, Y. T. Biosens. Bioelectron. 2011, 26, 3181.
(6) Yu, G.; Hu, L.; Vosgueritchian, M.; Wang, H.; Xie, X.; McDonough, J. R.; Cui, X.; Cui, Y.; Bao, Z. Nano Lett. 2011, 11, 2905.
(7) Meng, Y.; Zhao, Y.; Hu, C.; Cheng, H.; Hu, Y.; Zhang, Z.; Shi, G.; Qu, L. Adv. Mater. 2013, 1.
(8) Zhang, Y.; Nayak, T. R.; Hong, H.; Cai, W. Graphene: a versatile nanoplatform for biomedical applications. Nanoscale, 2012, 4, 3833.
(9) Ramuz, M. P.; Vosgueritchian, M.; Wei, P.; Wang, C.; Gao, Y.; Wu, Y.; Chen, Y.; Bao, Z. ACS Nano 2012, 6, 10384.
(10) Liu, Z.; Li, J.; Yan, F. Adv. Mater. 2013, 25, 4296.
(11) Yoon, T.; Shin, W. C.; Kim, T. Y.; Mun, J. H.; Kim, T.-S.; Cho, B. J. Nano Lett. 2012, 12, 1448.
(12) Hamada, I.; Otani, M. Comparative van der Waals density-functional study of graphene on metal surfaces. Physical Review B, 2010, 82.
(13) Kim, J.; Park, H.; Hannon, J. B.; Bedell, S. W.; Fogel, K.; Sadana, D. K.; Dimitrakopoulos, C. Science 2013, 342, 833.
(14) Meitl, M. A.; Zhu, Z.-T.; Kumar, V.; Lee, K. J.; Feng, X.; Huang, Y. Y.; Adesida, I.; Nuzzo, R. G.; Rogers, J. A. Transfer printing by kinetic control of adhesion to an elastomeric stamp. Nature Materials, 2006, 5, 33-38.
(15) Ferrari, A. C.; Meyer, J. C.; Scardaci, V.; Casiraghi, C.; Lazzeri, M.; Mauri, F.; Piscanec, S.; Jiang, D.; Novoselov, K. S.; Roth, S.; Geim, A. K. Phys. Rev. Lett. 2006, 97, 187401.
(16) Nie, S.; Wu, W.; Xing, S.; Yu, Q.; Bao, J.; Pei, S.; McCarty, K. F. Growth from below: bilayer graphene on copper by chemical vapor deposition. New Journal of Physics, 2012, 14, 093028.
(17) Li, Q.; Chou, H.; Zhong, J.-H.; Liu, J.-Y.; Dolocan, A.; Zhang, J.; Zhou, Y.; Ruoff, R. S.; Chen, S.; Cai, W. Nano Lett. 2013, 13, 486.
(18) Yu, Q.; Jauregui, L. A.; Wu, W.; Colby, R.; Tian, J.; Su, Z.; Cao, H.; Liu, Z.; Pandey, D.; Wei, D.; Chung, T. F.; Peng, P.; Guisinger, N. P.; Stach, E. A.; Bao, J.; Pei, S.-S.; Chen, Y. P. Nat. Mater. 2011, 10, 443.
(19) "Daily Copper Pricing Report 2014—Trade Service." Http://www.tradeservice.com/. 19 May 2014. Web. 20 May 2014. <http://www.tradeservice.com/copper_pricing/>.
(20) "13392Copper Foil, 0.025 mm 90.001 in) Thick, Annealed, Coated, 99.8% (metals Basis)." Http://www.alfa.com. 20 May 2014. Web. 20 May 2014. http://www.alpha.com/en/catalog/13382.
(21) Williams, E. D.; Ayres, R. U.; Heller, M. Environ. Sci. Technol. 2002, 36, 5504.
(22) "Calculations and References." EPA Clean Energy Calculations and References. Environmental Protection Agency, 20 May 2014. Web. 20 May 2014. <http://www.epa.gov/cleanenergy/energy-resources/refs.html>.
(23) Geim, A. K.; Novoselov, K. S. Nat. Mater. 2007, 6, 183.
(24) Vlassiouk, I.; Fulvio, P.; Meyer, H.; Lavrik, N.; Dai, S.; Datskos, P.; Smirnov, S. Carbon N. Y. 2013, 54, 58.
(25) Zhang, B.; Lee, W. H.; Piner, R.; Kholmanov, I.; Wu, Y.; Li, H.; Ji, H.; Ruoff, R. S. ACS Nano 2012, 6, 2471.
(26) Li, X.; Zhu, Y.; Cai, W.; Borysiak, M.; Han, B.; Chen, D.; Piner, R. D.; Colombo, L.; Ruoff, R. S. Nano Lett. 2009, 9, 4359.

What is claimed is:

1. A method of manufacturing a graphene layer on a substrate, comprising;
   providing a graphene layer disposed on a first substrate;
   applying a metal layer to the graphene layer to form a metalized graphene layer;
   exfoliating the metalized graphene layer from the first substrate; and
   laminating the metalized graphene layer to a second substrate, wherein the first substrate comprises copper.

2. The method of claim 1, wherein the graphene layer is a graphene monolayer.

3. The method of claim 1, wherein the graphene layer comprises two or more graphene layers.

4. The method of claim 1, wherein the metal layer comprises gold, nickel, cobalt, iron, silver, copper, tin, palladium, platinum, or alloy thereof.

5. The method of claim 4, wherein the metal layer comprises nickel or cobalt.

6. The method of claim 1, wherein the metal layer comprises a transition metal or alloy thereof.

7. The method of claim 6, wherein the metal layer comprises two or more sequentially deposited metal layers, wherein each layer comprises a transition metal or alloy thereof.

8. The method of claim 7, wherein the two or more sequentially deposited metal layers each have a thickness of about 1 to about 1000 nanometers (nm), about 20 nm to about 1000 nm, about 50 nm to about 750 nm, about 100 nm to about 500 nm, about 125 nm to about 250 nm, or about 150 nm to about 200 nm.

9. The method of claim 1, wherein the metal layer is applied to the graphene layer using a vacuum metallization process or an electrochemical metallization process.

10. The method of claim 9, wherein the vacuum metallization process is selected from the group consisting of electron beam evaporation, thermal evaporation and sputtering.

11. The method of claim 9, wherein the electrochemical metallization process is selected from the group consisting of an electroplating process, electroless deposition and atomic layer deposition.

12. The method of claim 1, wherein the metal layer has a thickness of about 1 to about 1000 nanometers (nm), about 20 nm to about 1000 nm, about 50 nm to about 750 nm, about 100 nm to about 500 nm, about 125 nm to about 250 nm, or about 150 nm to about 200 nm.

13. The method of claim 1, wherein the metal layer has a thickness of about 75 nm, about 100 nm, about 125 nm, about 150 nm, about 175 nm or about 200 nm.

14. The method of claim 1, wherein providing the graphene layer disposed on a first substrate comprises:
   providing the first substrate;

growing the graphene layer on the first substrate layer using a chemical vapor deposition process.

15. The method of claim 1, further comprising removing the metal layer from the graphene layer following lamination of the graphene layer to the second substrate.

16. The method of claim 1, wherein the second substrate is a flexible, solid, rigid, or fragile substrate.

17. The method of claim 1, wherein the second substrate is a flexible substrate selected from the group consisting of polyethylene terephthalate (PET), polyimide, polyethylene naphthalate (PEN), polycarbonate (PC), an elastomer polymer, a thermoplastic polymer, a chemical vapor deposition (CVD)-deposited polymer (ex.: Parylene-C or D or N) and combinations thereof.

18. The method of claim 1, wherein the second substrate is transparent.

19. A method of transferring a graphene layer to a flexible substrate, comprising:
providing a graphene layer on a substrate, the substrate comprising copper;
applying a metal layer to the graphene layer to form a metalized graphene layer; and
laminating the metalized graphene layer to the flexible substrate.

20. The method of claim 17, further comprising removing the metal layer from the graphene layer following lamination of the metalized layer to the flexible substrate.

21. The method of claim 1, wherein exfoliating the metalized graphene layer from the first substrate comprises
adhering an intermediary substrate to the metal layer;
applying force to the intermediary substrate sufficient to overcome the interaction between the first substrate and graphene layer to remove the metalized graphene layer from the first substrate.

22. The method of claim 21, wherein the intermediary substrate is thermal release adhesive tape.

23. The method of claim 22, further comprising removing the thermal release adhesive tape following removal of the metallized graphene from the first substrate.

24. The method of claim 22, wherein the thermal release adhesive tape is applied to the metal layer using a roller to apply the thermal release adhesive tape from one edge of the metal layer to an opposite edge of the metal layer.

25. The method of claim 21, wherein the adhering step and the removing step are performed concurrently.

26. The method of claim 21, wherein the intermediary substrate is adhered to the metal layer using van Der Waals forces, magnetic force, pressure differential, electrostatic force, or any combination thereof.

27. The method of claim 1, further comprising etching a pattern on the metalized graphene layer.

* * * * *